US007034963B2

(12) United States Patent
Klatchko et al.

(10) Patent No.: US 7,034,963 B2
(45) Date of Patent: Apr. 25, 2006

(54) METHOD FOR ADJUSTING EDGES OF GRAYSCALE PIXEL-MAP IMAGES

(75) Inventors: Asher Klatchko, Portland, OR (US); Samuel C. Howells, Portland, OR (US); Michael A. Ward, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 787 days.

(21) Appl. No.: 09/903,843

(22) Filed: Jul. 11, 2001

(65) Prior Publication Data

US 2003/0107770 A1 Jun. 12, 2003

(51) Int. Cl.
H04N 1/40 (2006.01)
H04N 1/405 (2006.01)
G06K 15/00 (2006.01)

(52) U.S. Cl. .................. 358/3.01; 358/1.9; 358/3.06
(58) Field of Classification Search .............. 358/1.9, 358/2.1, 3.01, 3.07, 3.06; 382/254–256, 382/266, 204, 205, 300
See application file for complete search history.

(56) References Cited

U.S. PATENT DOCUMENTS

| 5,329,614 | A |   | 7/1994  | Kidd et al. |
|-----------|---|---|---------|-------------|
| 5,363,119 | A |   | 11/1994 | Snyder et al. |
| 5,533,170 | A |   | 7/1996  | Teitzel et al. |
| 5,553,170 | A |   | 9/1996  | Kumagai |
| 5,631,981 | A |   | 5/1997  | Rao |
| 5,717,786 | A | * | 2/1998  | Kamei ................ 382/204 |
| 5,751,852 | A |   | 5/1998  | Marimont et al. |
| 5,852,475 | A | * | 12/1998 | Gupta et al. ............ 348/606 |
| 6,023,530 | A |   | 2/2000  | Wilson |

(Continued)

OTHER PUBLICATIONS

"Adaptive resampling algorithm for image zooming", by A.M. Darwish, M.S. Bedair and S.I. Shaheen, IEE Proc.-Vis. Image Signal Process., vol. 144, No. 4, Aug. 1997.*

(Continued)

*Primary Examiner*—Thomas D. Lee
*Assistant Examiner*—James A Thompson
(74) *Attorney, Agent, or Firm*—Patterson & Sheridan, LLP

(57) ABSTRACT

An algorithm (method) for sizing (adjusting edges 01) grayscale or dose level pixel-maps (raster images) real time for input into radiant beam lithography systems or similar dose level grayscale image rendering systems to compensate for systemic distortions such as edge bias and/or loss of linearity (i) successively assembles one or more frame matrixes of grayscale values from a parent pixel-map having edges and corners where an edge is defined by gray pixels having values between 1, 2, . . . n, or by pixels having at least one black (0-gray or dose level) neighbor; (ii) slides a sub-matrix window within each frame matrix, to find, calculate and store values for gradients perpendicular to the edges, and any corner within each frame matrix; (iii) loops over pixels within such sub-matrix window at each position within the frame matrix to adjust the grayscale value of each edge pixel found; and (iii) propagates a grayscale correction value to pixels inward or outward per the computed perpendicular gradient to establish a new edge position within each frame matrix, and where there is more than one frame matrix , (iv) reassembles the frame matrixes, thereby, generating a daughter grayscale or dose level pixel-map which upon projection and recording compensates for systemic distortions.

8 Claims, 10 Drawing Sheets

U.S. PATENT DOCUMENTS

| | | |
|---|---|---|
| 6,038,348 A | 3/2000 | Carley |
| 6,061,476 A | 5/2000 | Nichani |
| 6,141,460 A | 10/2000 | Amer et al. |
| 6,631,216 B1 * | 10/2003 | Hieda et al. ............. 382/300 |
| 6,674,904 B1 * | 1/2004 | McQueen ............. 382/199 |

OTHER PUBLICATIONS

Dana H. Ballard and Christopher M. Brown, Computer Vision, Prentice-Hall, Inc., Englewood Cliffs, New Jersey 07632; First Edition; 1982, pp. 76-77.

* cited by examiner

METHOD FOR ADJUSTING EDGES OF GRAYSCALE PIXEL-MAP IMAGES

BACKGROUND OF THE INVENTION

1. Field of the Invention

The invention relates to real time methods for sizing or adjusting edges and corners of grayscale pixel maps for input into raster or shaped beam pattern generators typical of radiant beam lithography writing tools.

2. Description of the Prior Art

Using computational techniques (algorithms) and computers to manipulate grayscale pixel maps of patterns and images is a standard, well known practice in many fields of graphics and data analysis. A pixel is typically understood as the smallest identifiable element or area composing a picture, pattern or image. A pixel map simply expresses the location of each pixel composing the picture, pattern or image in context of a two dimensional coordinate system. A pixel's gray level defines its relative intensity to the maximal level allowed in the mapping.

Radiant energy beam lithography systems are commonly used in integrated circuit production processes to print patterns or masks onto semiconductor wafers. In such systems, pixel maps of polygons, e.g., triangles trapezoids and rectangles, are created where each pixel is quantified and expressed or printed onto a mask or wafer surface by the radiant energy beam. The dose or level of exposure the pixel is determined by a grayscale assigned to the corresponding pixel, typically 0 to a maximum, e.g., 16, where 0 corresponds to 0-dose or black, and 16 corresponds to 16-dose or white. The intervening levels correspond to ascending levels of gray toward white.

In printing systems, images and characters are represented in grayscale pixel maps where each pixel corresponds to a unit area or dot, and the grayscale assigned to each pixel determines the level or densities to be expressed or printed at each corresponding unit area. For color images, complementary color pixel maps are generated and combined to reproduce an image. [See U.S. Pat. No. 6,021,255 Hayashi et al. & U.S. Pat. No 6,141,065 Furuki, et al.] In additive or radiant systems such as computer monitors, Red, Blue and Green (RGB) pixel maps are created and combined to project an image. In subtractive or reflective systems such as poster images, Cyan, Magenta, Yellow, blacK (CMYK) pixel maps or dots are printed and combined onto a surface to reflect an image.

Once created, digitally expressed pixel maps can be enlarged or magnified, reduced or de-magnified, and/or distorted or morphed using algorithms and computers. However, when pixel resolution is in nanometer (micro inch) ranges, the number of pixels per macroscopic unit area is astronomical. Time and memory requirements for processing and then storing such high resolution pixel maps can be quite substantial even with advanced data compression schemes and high cycle [MHz & GHz] CPU processors.

In applications where issues such as depth and color are not of concern, (e.g., radiant energy beam lithography applications) the most significant elements of the mask or pattern expressed in the pixel maps are the boundaries between the 0 dose (black) regions and the maximum dose (white) regions. Such boundaries are expressed in levels of grayscale. Yet as skilled and even unskilled manipulators/editors of pixel maps have experienced, a Cartesian array of rectangular pixels cannot continuously express an inclined boundary, i.e., a boundary not aligned with the Cartesian coordinates of the expressing system. While grayscale allows some smoothing (anti-aliasing) of inclined boundaries, such boundaries remain rough, meaning the expressed boundary varies somewhat regularly between limits. Such boundary roughness can cause problems particularly in very large-scale integrated circuits (VLSI circuits) where feature sizes range below the 150 nm scale.

Photo and other lithography systems present a host of boundary or edge effects including scattering, wavelength, and effects of the components directing the writing radiant beams. In addition there are boundary effects arising from: (i) the properties of the mediums in/onto which the masks or pixel maps are written or expressed, (e.g. refraction and substrate reflectivity); and (ii) subsequent processing of the exposed mask or printed pixel map, (e.g., etch bias).

In other words, skilled semiconductor mask designers are confronted with a dilemma of having to create VLSI circuitry patterns or masks for each particular lithography tool, each particular wafer composition, and each expected post exposure wafer processing scheme. An alternative would be to design and store a digitized pixel map of an idealized (master) mask and then use a real time computational process or procedure to modify or 'size' the master mask on the fly to meet anticipated parameters imposed or expected of the particular lithography tool, the particular wafer composition and/or the particular post exposure wafer processing scheme.

A primary criterion for determining the efficacy, hence desirability of any particular computer implemented algorithm or technique for modifying a pixel map is time. Algorithms that limit or minimize the number of operations that must performed by the computer to effect a acceptable change are preferable to those that effect an accurate or correct change but are expensive time wise and/or computationally.

SUMMARY OF THE INVENTION

The invented computer implemented, algorithm sizes, in real time, an idealized production mask or pattern expressed as a digitally encoded, grayscale pixel map, to provide output pixel map image signals to any particular dose level, grayscale image rendering system that compensates for anticipated systemic distortions of that particular dose level, grayscale image rendering system.

The computational steps of the invented sizing algorithm include:

(i) inputting a digitally encoded, grayscale pixel map from a source for generating a parent pixel map having edges where an edge is defined by gray pixels having values between 1, 2, . . . n, or by pixels having at least one black (0-gray or dose level) neighbor; and (ii) finding and marking edge pixels expressed within a frame of the parent pixel map; and (iii) finding and marking convex (outside) corner edge pixels and inside concave (inside) corner edge pixels) within the frame;

(iv) sliding a sub-matrix window within the frame, to calculate and store gradient values for edge pixels (in a direction perpendicular) relative to each edge within the frame;

(v) looping over pixels within the frame to adjust the grayscale value of the edge and corner pixels and their nearest neighbors;

(vi) propagating a grayscale correction value to pixels inward or outward from each adjusted edge and corner pixel within the frame in a direction normal to each edge to establish a new edge position within the frame, and (vii) where the parent pixel map is composed of a plurality of frames, reassembling the frames, thereby, generating a daughter grayscale or dose level image signal input for a radiant energy beam or similar dose-level image rendering system that upon projection and recording, compensates for expected systemic distortions.

The primary advantage of the invented algorithm (computational method) is its superb time and computational economy in sizing (adjusts edges of) grayscale or dose level pixel-maps. The invented algorithm can provide real time processing capacity to graphics engine interfaces between original grayscale pixel maps and pattern generators of lithography tools. With the invented algorithm intermediate translations necessitated by format changes are eliminated.

Other significant advantages of the invented algorithm relate to the fact that it allows for particular scaling of output raster image signals in the native (machine) language of the particular system to compensate for both anticipated and observed, in process, systemic distortions of any particular dose level, grayscale image rendering system.

Another advantage of the invented sizing algorithm is that the grayscale anti-aliasing of images expressed in an input pixel map is preserved in the sized grayscale images expressed in the output pixel map.

A feature of the invented sizing algorithm is that it effects local sizing changes to grayscale images expressed in a pixel maps, but does not magnify, de-magnify or change the size of the pixel maps. In other words, the input and output pixel maps are the same size, only the grayscale images expressed in the pixel maps are different sizes.

The particular utility of the invented algorithm is that it enables nanometer adjustments of mask edges in VLSI circuitry production for particular radiant energy beam lithography tools such as that described in U.S. Pat. No. 5,553,170 *Rasterizer for A Pattern Generation Apparatus* Teitizel et al. 2 Jul. 1996 and/or for particular semiconductor wafer compositions and/or for particular post exposure wafer processing schemes.

DETAILED EXPLANATION OF EXEMPLARY AND PREFERRED MODES OF IMPLEMENTING THE INVENTED SIZING ALGORITHM

Figure 1:
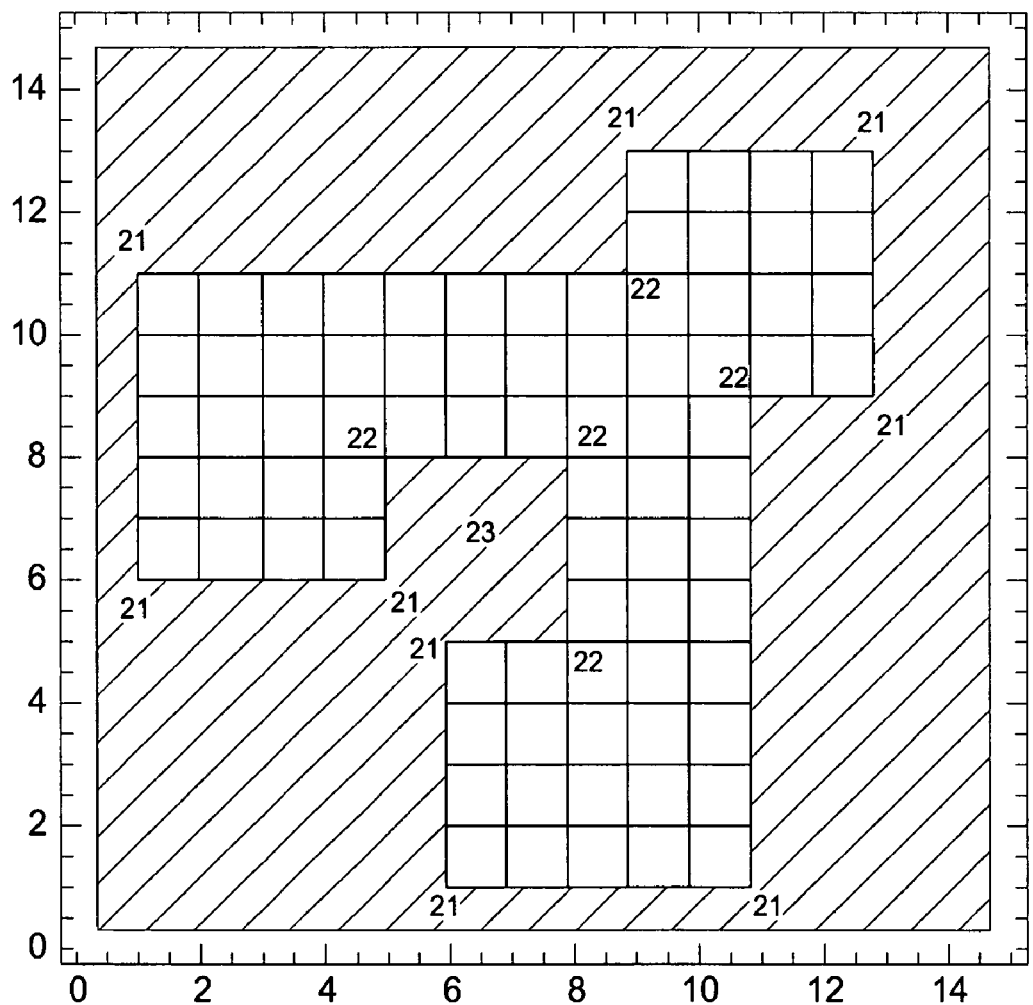
FIG. 1 is a parent or master pixel map of a polygonal elbow element with inside and outside corners representative of mask or pattern written to the surface by a dose level, grayscale image rendering system.

FIG. 1 presents a parent or master pixel map of a polygonal elbow element where the edges of the element are presented in grayscale. (An aerial image of that elbow element is shown as curve M in FIG. 5). As illustrated in FIG. 1, the elbow element is surrounded by 0-dose (black) pixel elements, while the interior of the element is presented by 16-dose (white) pixel elements. A polygonal elbow element is chosen for purposes of explanation because it includes outside or convex corners 21, inside or concave corners 22, and an interior 0-dose (black) area 23. First, the edges of the pixel map of the polygonal elbow element are located using the definition of gray pixels having values between 1, 2, . . . 16, or pixels having at least one 0-dose (black) neighbor.

Assume a 3×3 sub-matrix of grayscale pixels expressing an edge, $$G : \begin{pmatrix} g11 & g12 & g13 \\ g21 & g22 & g23 \\ g31 & g32 & g33 \end{pmatrix}$$

The edge operator maps the matrix G into a matrix E:
G→E $$E = \begin{pmatrix} e11 & e12 & e13 \\ e21 & e22 & e23 \\ e31 & e32 & e33 \end{pmatrix}$$

Computationally this operation may be expressed and preformed as follows.

Let "M113, M133, M313, M311" and "MASK" be Boolean quantities, the procedure below counts the number of "0"s in the gray matrix G and assigns a value 0, 1 or 2 to a pixel:

Procedure to flag an edge:
M113: g11==0 && g13==0
M133: g13==0 && g33==0
M313: g31==0 && g33==0
M311: g31==0 && g11==0
MASK==M113||M133||M313||M311
if (MASK==TRUE)

F=½ else

F=1

Z=the number of "0" pixels in the matrix, G
if (Z==2)

Z=Z*F if (Z>1)
E=2 else

E=Z

Here a value "0", means the pixel is not an edge pixel, "1" means it has a single "0" neighbor (may be a corner or an inclined edge etc.) and "2" means it is a proper edge.

The gradient of the grayscale pixels can be computed using the following formula:

$$(\nabla G)_{ij} = \left\{ \left( \sum_{j-1}^{j+1} G(i+1, j) - G(i-1, j) \right) \cdot \left( \sum_{i-1}^{i+1} G(i, j+1,) - G(i, j-1,) \right) \right\}$$

which is equivalent to using the known gradient operators:

$$\nabla_x := \begin{pmatrix} -1 & 0 & 1 \\ -1 & 0 & 1 \\ -1 & 0 & 1 \end{pmatrix} \text{ and } \nabla_y := \begin{pmatrix} 1 & 1 & 1 \\ 0 & 0 & 0 \\ -1 & -1 & -1 \end{pmatrix}$$

After proper normalization well-defined gradients are obtained. The entire procedure is depicted below:
Procedure to compute a gradient:

$P_x = g13 - g11 + g23 - g21 + g33 - g31$ $P_y = g11 - g31 + g12 - g32 + g13 - g33$ $\text{norm} = P_x P_x + P_y P_y$ $\nabla_x = P_x / \text{norm}$ $\nabla_y = P_y / \text{norm};$ The computed gradients are oriented perpendicularly with respect to the expressed boundary surrounding the elbow element expressed in the pixel map of FIG. 1.

Figure 2:
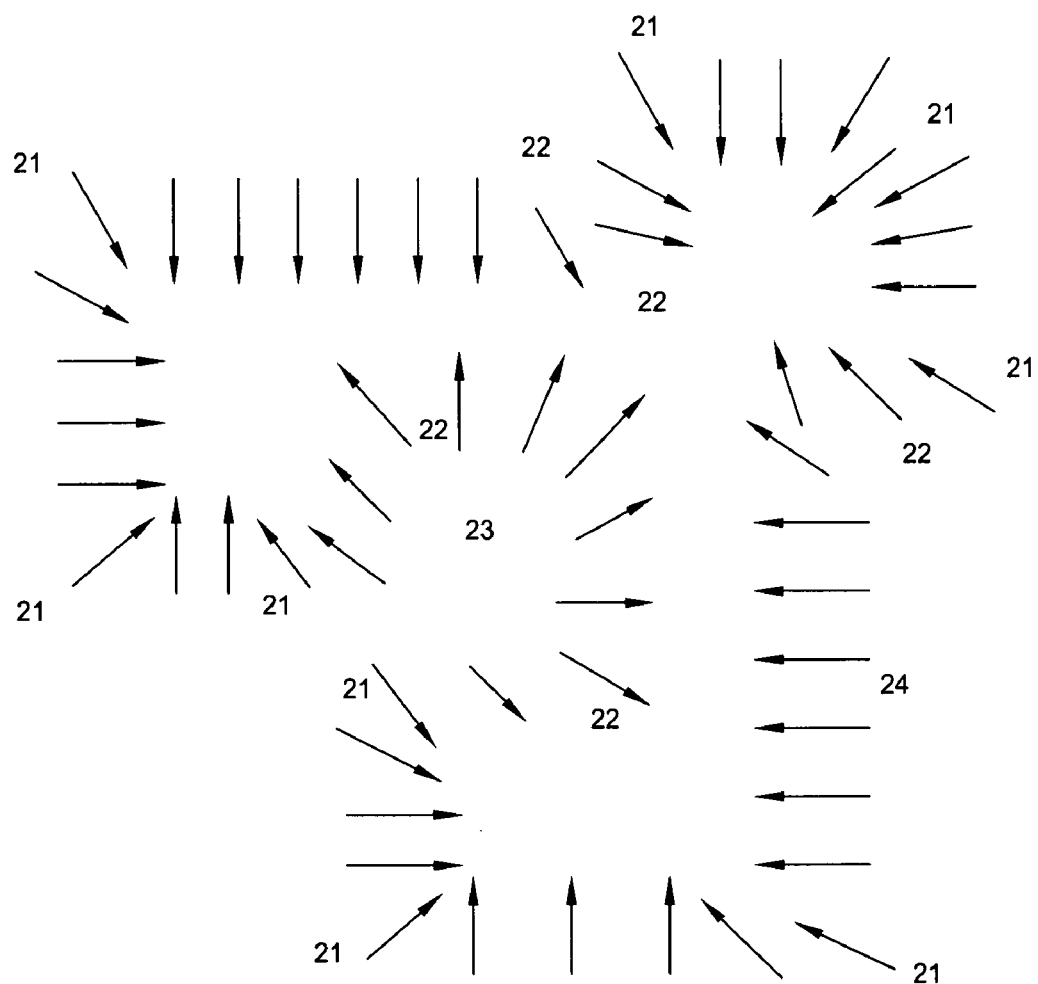
FIG. 2 is a quill diagram of the parent pixel map shown in FIG. 1 where the arrows indicate the direction of gradients perpendicular to the edges expressed in the pixel map.

FIG. 2 graphically illustrates the results of such an exemplary gradient computation on the elbow element with unit vector quills 24 perpendicularly oriented with respect to the located grayscale boundary between the 0-dose (black) regions and 16-dose (white) regions of the pixel map. The direction of the quills 24 indicated by the arrowheads whether pointing inward or outward indicate whether the polygonal elbow element will be sized down (shrunk) or sized up (expanded). As illustrated, the arrowheads on the quills indicate the elbow element will be downsized. The direction of the vector quills 24 (indicated by the arrowheads) may be altered for example by changing sign from positive to negative or visa versa depending upon the convention chosen, or by changing the convention for assigning direction, e.g., from an indication of increasing grayscale values to an indication of decreasing grayscale values.

From the quill diagram of FIG. 2 those skilled in topology and morphology should observe that for outside or convex corners 21, in a downsizing operation the gradients converge toward common loci (values); however in upsizing operations, the gradients diverge from common loci or values. The converse is the case for inside or concave corners 22; in a downsizing operation, the gradients diverge from common loci (values), and in an upsizing operation converge toward common loci. The skilled topologist/morphologist should also observe that the upsizing of an element expressed in dose (white) regions of pixel map is the equivalent of downsizing the 0-dose (black) regions of that pixel map, and outside or convex corners 21 of dose (white) expression are inside or concave corners of 0-dose (black) expression in the pixel map.

Because downsizing inside or concave corners 22 and upsizing outside corners 22 involves, respectively, ballooning decreasing grayscale into 16-dose (white) regions, and ballooning increasing grayscale into 0-dose (black) regions, such diverging corner pixels must be recognized and relocated with their grayscale adjusted appropriately relative to the common locus of divergence of it and its neighboring pixels. This relocation and grayscale adjustment may be accomplished computationally or by use of look up tables specially create/calculated for such diverging corners (whether inside or outside) of particular angle and circumferential configurations.

Diverging corners may be computationally detected by mapping the edge matrix E into a Boolean I which is true for an diverging corner and false otherwise, e.g.:
Procedure to flag a corner:

$\text{Edge\_sum} = e11 + e12 + e13 + e21 + e22 + e23 + e31 + e32 + e33$ if (Edge_sum==5)

$$I = 1 \quad \text{i.e.} \quad E = \begin{pmatrix} 0 & 0 & 0 \\ 2 & 1 & 0 \\ 0 & 2 & 0 \end{pmatrix}$$

else
I=0
Because of the edge topology this operation will detect diverging corners.

Downsizing outside or convex corners 21 is simpler than inside or concave 22 because propagating grayscale inward along the gradient direction means convergence and overlapping and decreasing of dose values of neighboring pixels.

Propagating the grayscale normal to a located edge of an element expressed in a pixel map may be computationally accomplished with the following operators expressed in C-Code:

A) FOR PROPAGATING GREY NORMALLY TO ANY EDGE INCLINED AT 45° ($\pi/4$) RELATIVE TO THE COORDIATES OF THE PIXEL MAP:

A) FOR PROPAGATING GREY NORMALLY TO ANY EDGE INCLINED AT 45° ($\pi/4$) RELATIVE TO THE COORDINATES O FTHE PIXEL MAP:

```
/*********/
static void Propagate45Rule(sizing_t *SzPtrs, int row, int col, float dg1, float xhat,
        float yhat, int sign_x, int sign_y)
{
    if(SzPtrs->EdgeValue[row][col+sign_x]<2)
    {
        float g = SzPtrs->GreyValue_float[row][col+sign_x];
        float gcorr = (float)ceil(dg1*xhat*(1+yhat));
```

```
        float dgx = g - (float(SzPtrs->Check[row][col] = sign_x]*gcorr);
        int px = 1;
        SzPtrs->GreyValue_float[row][col+sign_x] = MAX(dgx,0);
        while(dgx < 0)/*disipate the rest of the grey*/
        {
            dgx = dgx*xhat*(1+yhat);
            if(SzPtrs->GreyValue[row][col+sign_x*(1+px)]>0)
            {
                float g = SzPtrs->GreyValue_float[row][col+sign_x*(1+px)];
                dgx = g - (float)(fabs(dgx)*(SzPtrs-
                    >Check[row][col+sign_x*(1+px)]));
                SzPtrs->GreyValue_float[row][col+sign_x*(1+px)] =
                    reduce_gray(g,dgx);
                px += 1;
            }
            else
                dgx = 0;
        }
    }
    if(SzPtrs->EdgeValue[row+sign_y][col]<2)
    {
        float g = SzPtrs->GreyValue_float[row+sign_y][col];
        float gcorr = (float)ceil(dg1*yhat*(1+xhat));
        float dgy = g - (float)(SzPtrs->Check[row+Sign_y][col]*gcorr);
        int py = 1;
        SzPtrs->GreyValue_float[row+sign_y][col] = MAX(dgy,0);
        while(dgy <0)/*disipate the rest of the grey*/
        {
            dgy = dgy*yhat*(1+xhat);
            if(SzPtrs->GreyValue[row+sign_y*(1+py)][col]>0)
            {
                float g = SzPtrs->GreyValue_float[row+sign_y*(1+py)][col];
                dgy = g - (float)(fabs(dgy)*(SzPtrs-
                    >Check[row+sign_y*(1+py)][col]));
                SzPtrs->GreyValue_float[row+sign_y*(1+py)][col] =
                    reduce_gray(g,dgy);
                py += 1;
            }
            else
                dgy = 0;
        }
    }
}
                                            /*********/
B) FOR PROPAGATING GREYSCALE NORMAL TO AN EDGE INCLINED AT ANGLES OTHER THAN
    45° (π/4):
                                            /*********/
static void PropagateNon45Rule(sizing_t *SzPtrs, int row, int col, float dg1, float xhat,
            float yhat, int sign_x, int sign_y)
{
    if(xhat > yhat)
    {
        if(SzPtrs->EdgeValue[row][col+sign_x]<2)
        {
            float g = SzPtrs->GreyValue_float[row][col+sign_x];
            float dgx = g - dg1*xhat*(1+yhat);
            int px = 1;
            SzPtrs->GreyValue_float[row][col+sign_x] = MAX(dgx,0);
            while(dgx < 0)/*disipate the rest of the grey*/
            {
                dgx = dgx*xhat*(1+yhat);
                if(SzPtrs->GreyValue[row][col+sign_x*(1+px)]>0)
                {
                    float g = SzPtrs-
                        >GreyValue_float[row][col+sign_x*(1+px)];
                    dgx = g - (float)(fabs(dgx)*(SzPtrs-
                        >Check[row][col+sign_x * (1+px)]));
                    SzPtrs->GreyValue_float[row][col+sign_x*(1+px)] =
                        reduce_gray(g,dgx);
                    px += 1;
                }
                else
                    dgx = 0;
            }
        }
    }
    if(yhat > xhat)
    {
        if(SzPtrs->EdgeValue[row+sign_y][col]<2)
```

-continued

```
        {
            float g = SzPtrs->GreyValue_float[row+sign_y][col];
            float dgy = g - dg1*yhat*(1+xhat);
            int py = 1;
            (SzPtrs->GreyValue_float[row+sign_y][col] = MAX(dgy,0);
            while(dgy < 0)/*disipate the rest of the grey*/
            {
                dgy = dgy*yhat*(1+xhat);
                if(SzPtrs->GreyValue[row+sign_y*(1+py)][col]>0)
                {
                    float g = SzPtrs-
                        >GreyValue_float[row+sign_y*(1+py)][col];
                    dgy = g - (float)(fabs(dgy)*(SzPtrs-
                        >Check[row+sign_y*(1+py)][col]));
                    SzPtrs->GreyValue_float[row+sign_y*(1+py)][col] =
                        reduce_gray(g,dgy);
                    py += 1;
                }
                else
                    dgy = 0;
            }
        }
    }
}

/*********/
C. FOR PROPAGATING GREYSCALE TO NEIGHBORING PIXELS IN THE DIRECTION OF THE
                                    GRADIENT:
/*********/
static void PropagateGrey(sizing_t *SzPtrs, int row, int col, float dg)
{
    float dg1 = dg - SzPtrs->GreyValue[row][col];
    float xhat = (float)fabs(SzPtrs->Gradient[row][col].x);
    float yhat = (float)fabs(SzPtrs->Gradient[row][col].y);
    int sign_x = (int)(SzPtrs->Gradient[row][col].x/xhat);
    int sign_y = (int)(-SzPtrs->Gradient[row][col].y/yhat);
    SzPtrs->GreyValue_float[row][col] = 0;
    if(xhat > COS45 && yhat > COS45)
    {
        /*45° rule only for partial edge pixels: edge code < 2*/
        Propagate45Rule(SzPtrs, row, col, dg1, xhat, yhat, sign_x, sign_y);
    }
    else
    {
        /*Non 45° rule*/
        PropagateNon45Rule(SzPtrs, row, col, dg1, xhat, yhat, sign_x, sign_y);
    }
}
```

Figure 6:
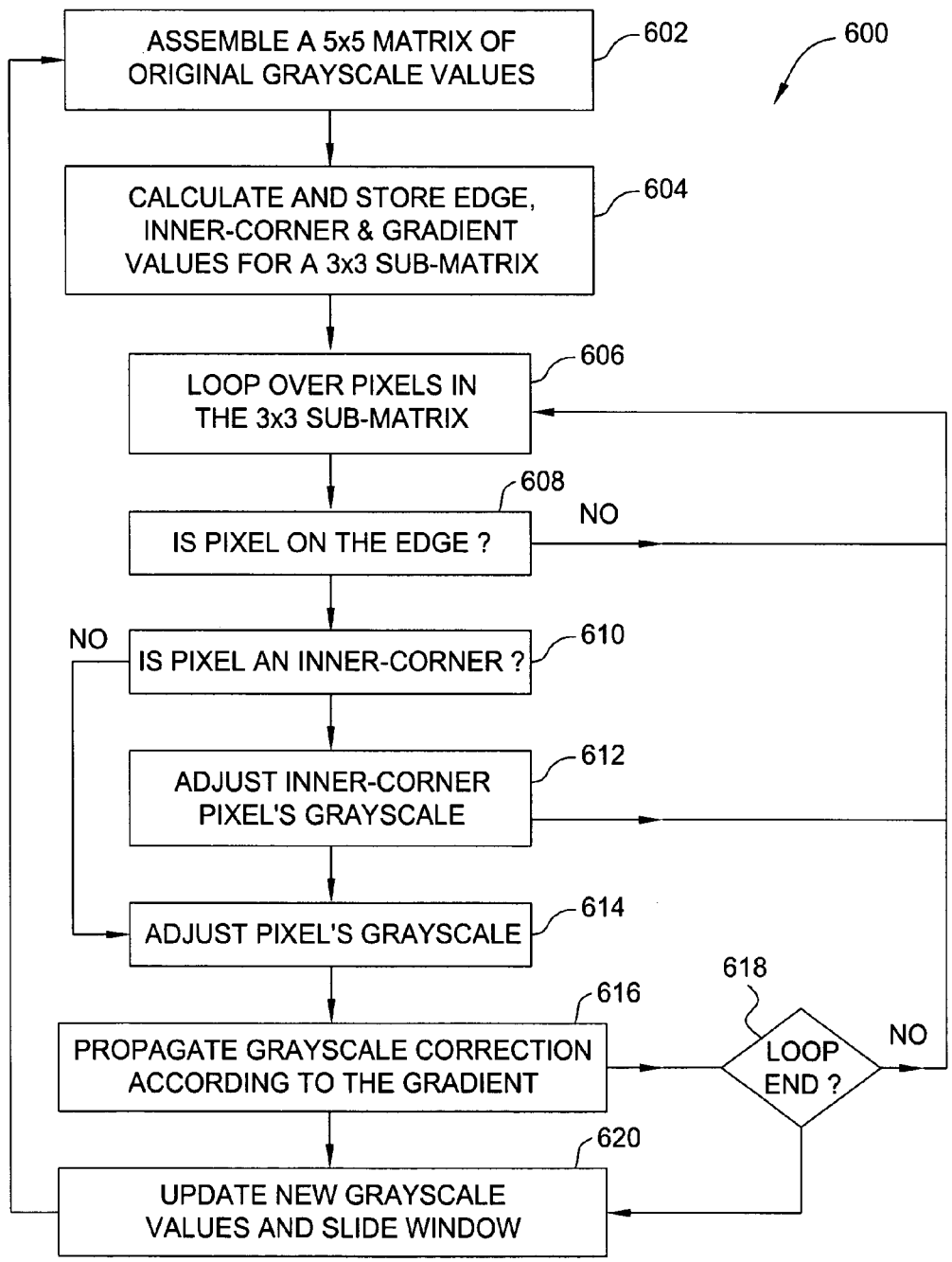
FIG. 6 is a flow chart illustrating steps for implementing the invented sizing algorithm for sizing a pixel map.

FIG. 6 expresses in a flow chart computational steps that may be utilized for implementing the invented algorithm once the grayscale boundary region is located within a pixel map. The particular scheme outlined contemplates utilizing a sliding 3×3 matrix within a 5×5 matrix of grayscale values.

To implement the invented algorithm as outlined above the skilled topologist/morphologist must ascertain or select a desired sizing distance (S), i.e., the distance the particular element expressed in the grayscale pixel map is to be downsized (shrunk) or upsized (expanded). The sizing distance (S) then must be parameterized to the grayscale and pixel size of the particular radiant beam machine system or printer contemplated for writing the sized pixel map to the recording surface. Pixel size in this case is the smallest identifiable element or unit area that can be recorded by the particular machine system. Preferably pixel size is expressed as a unit of length, i.e., for higher resolution machine systems, in nanometers. Depending on the machine system, the length parameter might be viewed as a radius of a dot, or as the length of the side of a square. The skilled topologist/morphologist should also note that where pixel size is not the same orthogonally in the 2 dimensions of the pixel map, i.e., the pixel is elliptical or rectangular, the operators determining the gradients and propagating the grayscale must be appropriately modified where such deviation from symmetry is significant.

The operators expressed above provide skilled topologist/morphologist with computational tools or operators developed for implementing the invented algorithm. However, many different computational (coding) systems exist, each with distinct classes of operators that may be used to perform similar if not the same operations as those describe above to achieve sizing (shrinking or expansion) of a planar image with edges expressed in grayscale in a pixel map. Skilled topologist/morphologist should also understand and appreciate that all displayed images, other than those expressed in three dimensional space, e.g. holograms, are planar.

The invented algorithm can be more generally expressed for shrinking a pixel map image with grayscale edges as follows:

Define the altered gray level of a pixel (i,j) and the amount of gray left to be propagated as:

$$dG'(i,j) = \text{Max}(G(i,j)-g, 0)$$

$$\vec{\delta} G(i,j) = |G(i,j)-g| \cdot (\nabla_x, \nabla_y)$$

where g=Sizing distance (S)/gray_to_distance, a machine dependent constant that is equal to the size of the pixel $R_p$ divided by the number of gray levels n begin:

```
loop over pixels
{
    if(pixel ij is an edge pixel)
    {
        V(i, j) = estimated gradient;
        store the value G'( i, j) of the new pixel;
        if(||δG(i, j)||) > 0
        {
        propagate the vector difference to the neighboring pixels along
        the gradient direction (projections);
        }
    }
}
end:
```

For expanding a pixel map image with grayscale edges, only minor changes are needed, in particular:

the sign ("−"→"+") and Max($G(i,j)$−$g$,0)→Min($G(i, j)$+$g$,gmax)

In one embodiment, a flow chart 600 depicted in FIG. 6 begins at step 602 by assembling a 5×5 matrix of original grayscale values. At step 604, the edge inner-corner and gradient values for a 3×3 sub-matrix within the 5×5 matrix of grayscale values are calculated and stored. At step 606, a loop over the pixels and the 3×3 sub-matrix is performed. At step 608, it is determined if the pixel is on an edge. If a determination is made at step 608 that the pixel is not on an edge, the method returns to step 606. If a determination is made at step 608 that the pixel is on en edge, the method proceeds to step 610 where it is determined if the pixel is on an inner-corner. If a determination is made at step 610 that the pixel is on an inner-corner, the inner-corner pixel's grayscale is adjusted at step 612 and the method proceeds to step 606. If a determination is made at step 610 that the pixel is not on an inner-corner, the method proceeds to step 614 to adjust the pixel's grayscale. The grayscale correction is propagated according to the gradient at step 616. At step 618, the method determines If the loop is at the end. if a determination is made at step 618 that the loop is not at an end, the method proceeds to step 606. If a determination is made at step 618 that the loop is at an end, then new grayscale values and slide window are updated at step 620.

Figure 7A:
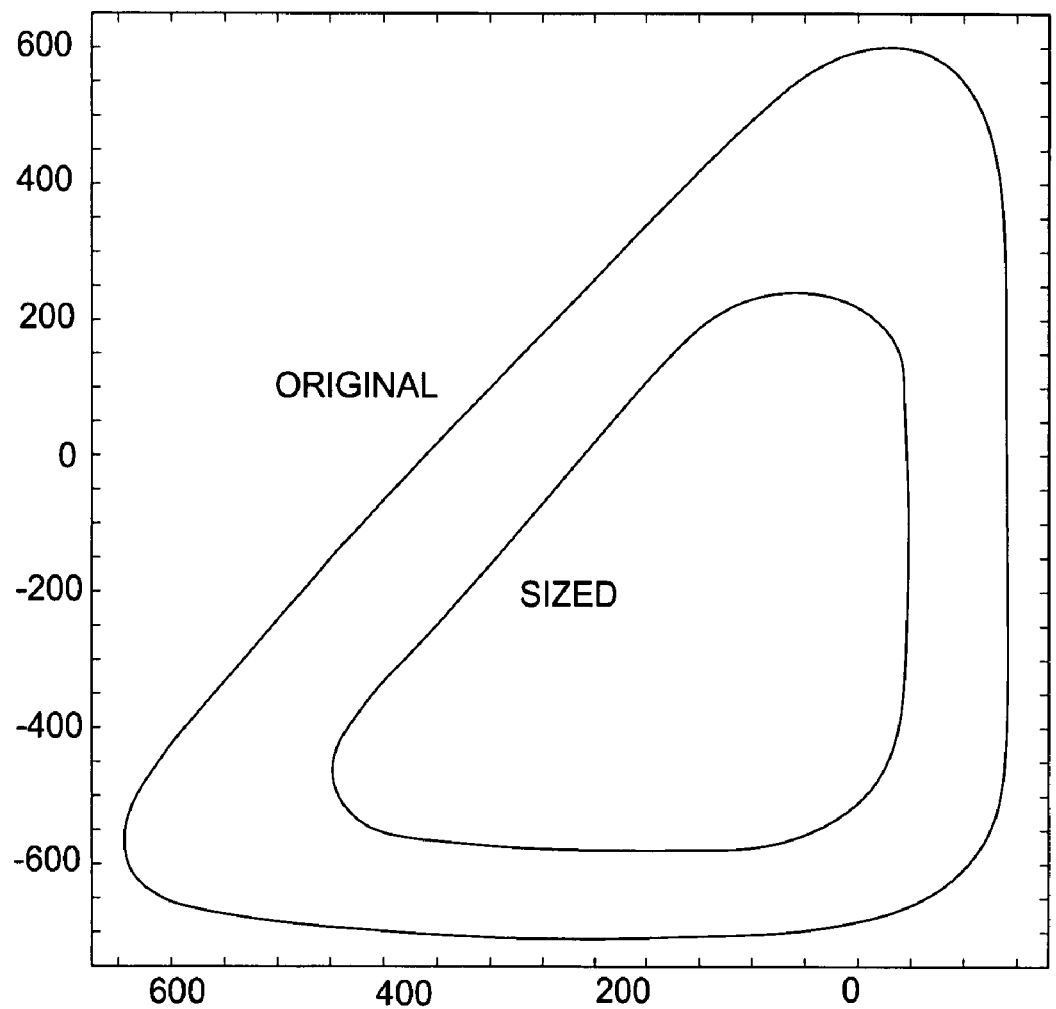
FIG. 7*a* presents 2 nested aerial curves showing an original 60° degree triangular element expressed in a pixel map and that triangle element downsized 100 nanometers.
Figure 7B:
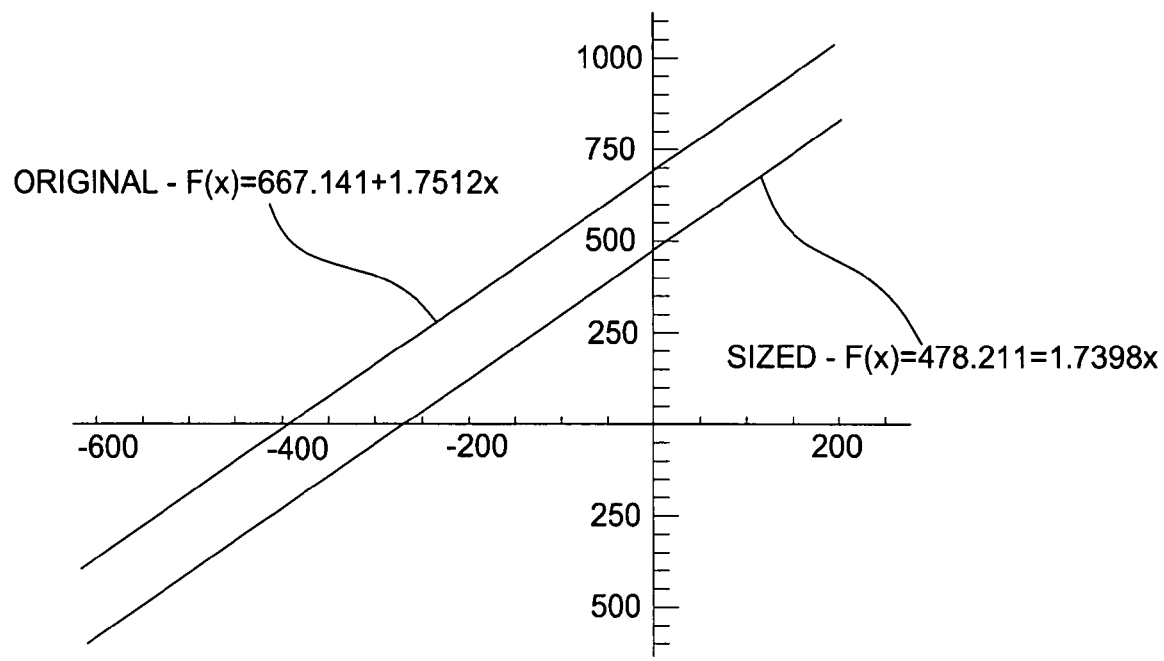
FIG. 7*b* presents a graph of the residuals after a linear regression or fit showing similar angles within expected resolution of the respective angled boundary of the original and that of the downsized 60° degree triangular element.
Figure 7C:
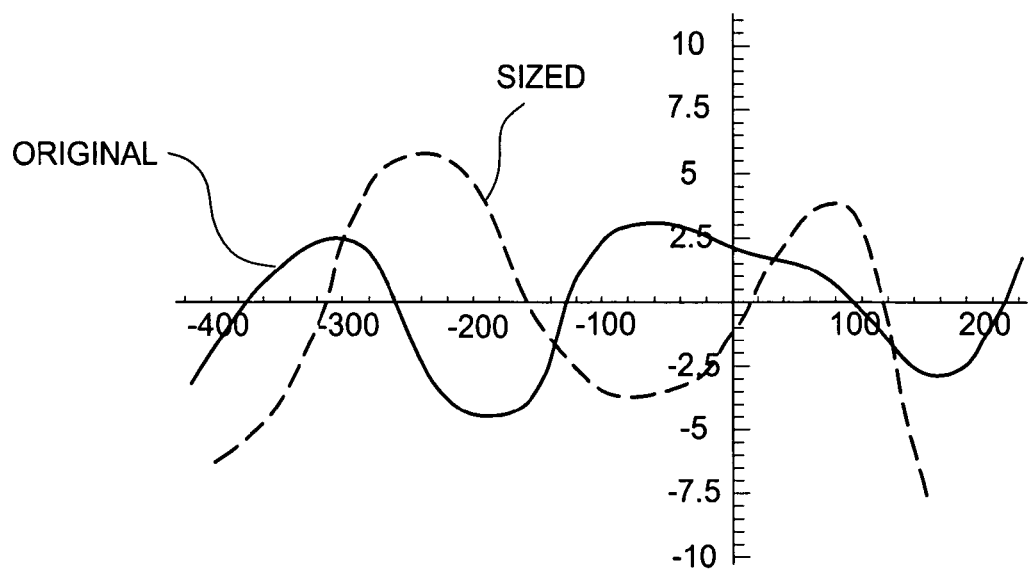
FIG. 7*c* presents a graph plotting the residuals of the angled boundaries relative to an idealized angled boundary of the original and downsized 60° degree triangular element.

FIGS. 7*a–c*, are graphs plotting data recovered from an original and a downsized 60° triangular element expressed in a pixel map. FIG. 7*a* presents aerial image curves obtained from the original and the downsized triangular element. Here the skilled topologist/morphologist should note the effects of convergence due to overlapping lower dose pixels in the downsized element discussed above. In particular, note the spacing between the respective aerial curves is greatest at the 30° corner, less at the 60° degree corner, and still less again at the 90° degree corner. In all cases, as indicated by the nested aerial curves of FIG. 7*a*, the spacing at the outside (convex) corners is greater than that between the liner sections aligned with the orthogonal coordinates of the pixel map and the 60° inclined boundaries.

FIGS. 7*b* & *c* indicate the efficacy of the particular computational method chosen (calculation or look-up table) for propagating grayscale normal to a located angled edge of an element expressed in a pixel map, where that edge is angled with respect to the coordinates of the pixel map. FIG. 7*b* are plots of the tangents of the respected inclined boundaries after a linear (regression) fit. The result of the fit shows the original angled edge and the sized angled edge are at the same angle. The data plotted in FIG. 7*c* shows that the residuals or roughness of the original 60° edge is approximately replicated by similar residuals (roughness) in the downsized 60° edge offset by 100 nanometers.

In fact, the skilled practical topologist/morphologist can glean sufficient information from data analysis and plots such as those as presented in FIGS. 7*a–*7*c*, to identify particular orientations and configurations of element edges expressed in pixel maps suited for propagating grayscale normal to the located edge as reusable code units, or as a calculation, or pursuant a look-up table.

Figure 3A:
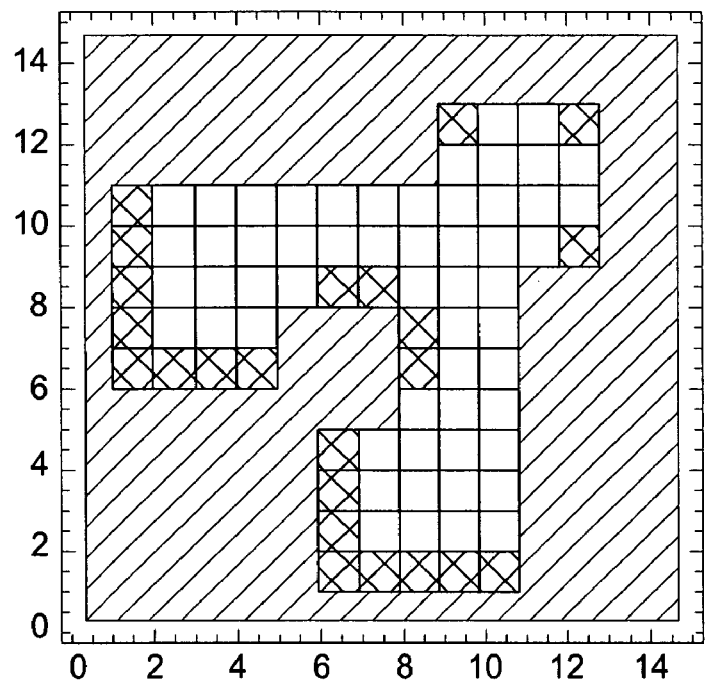
FIGS. 3*a–d* present four sizing passes downsizing the parent pixel map shown in FIG. 1 by 50 nm (nanometers).
Figure 3B:
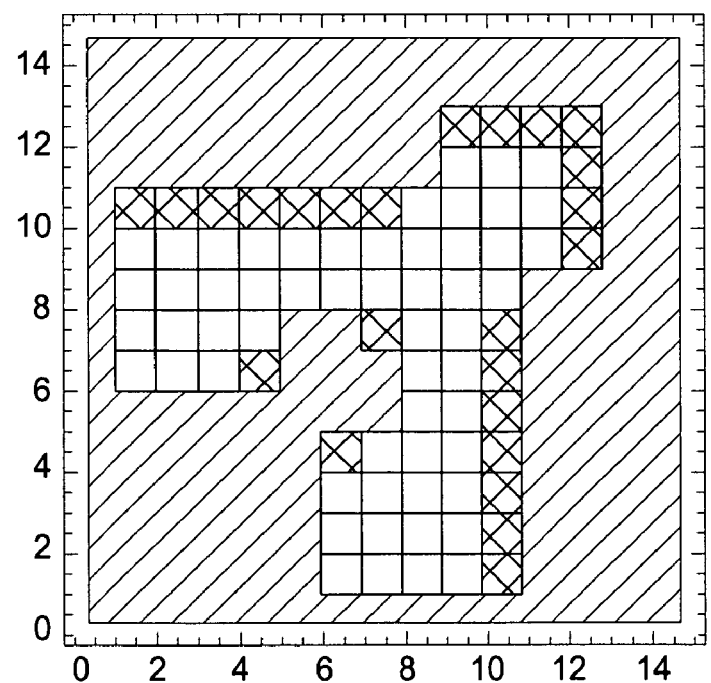
Figure 3C:
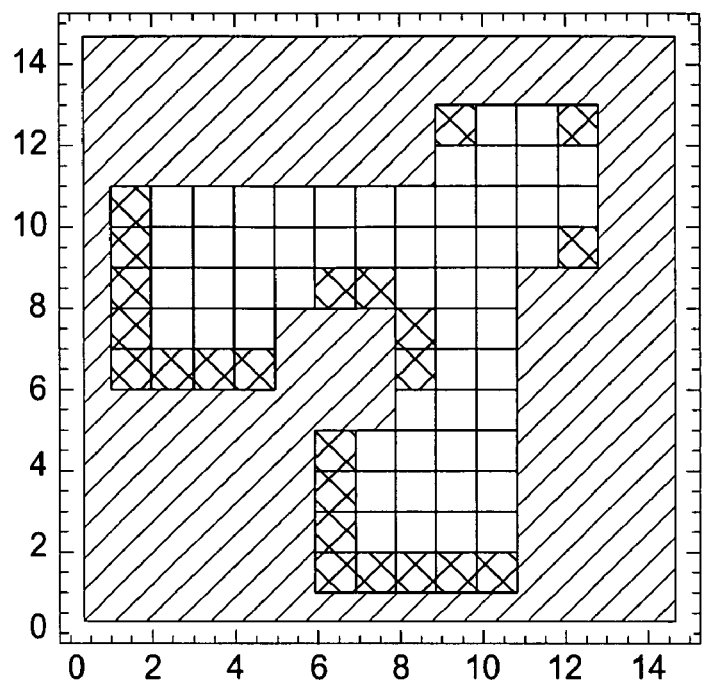
Figure 3D:
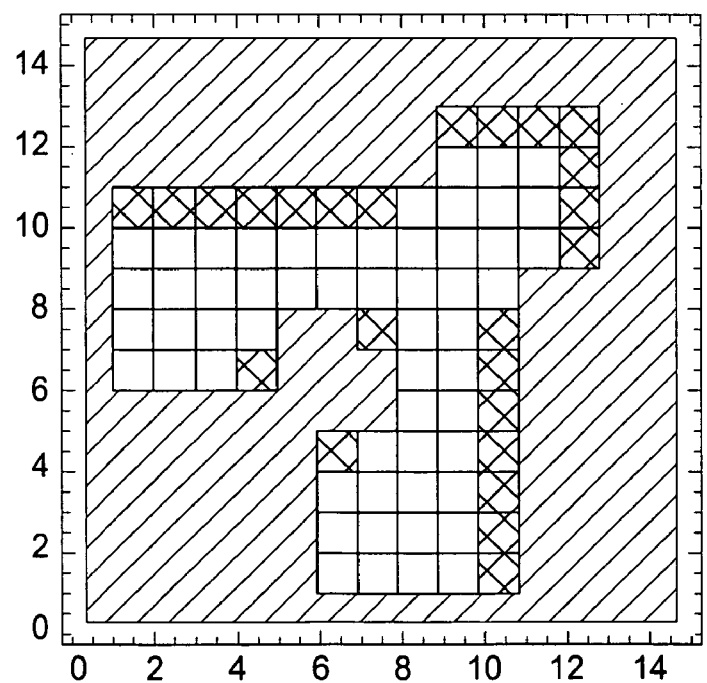
Figure 4A:
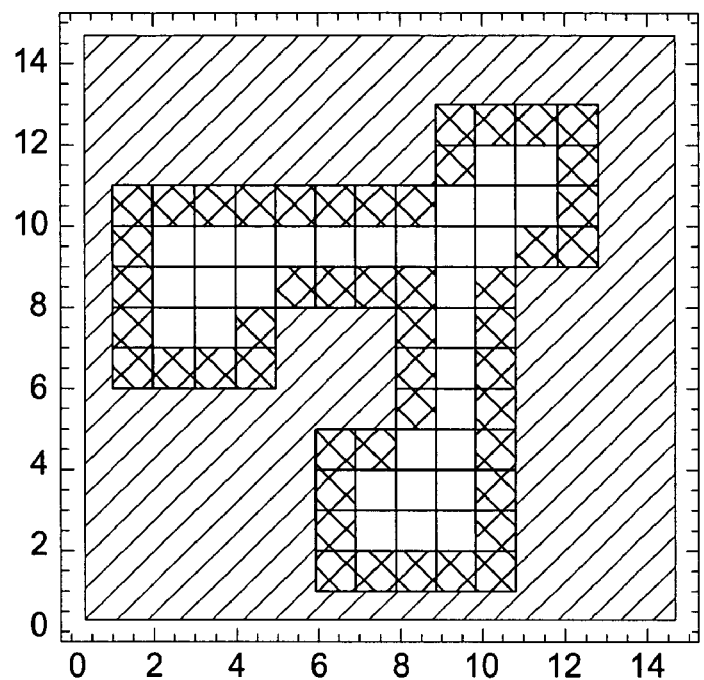
FIGS. 4*a–d* present four sizing passes downsizing the parent pixel map shown in FIG. 1 by 100 nm (nanometers).
Figure 4B:
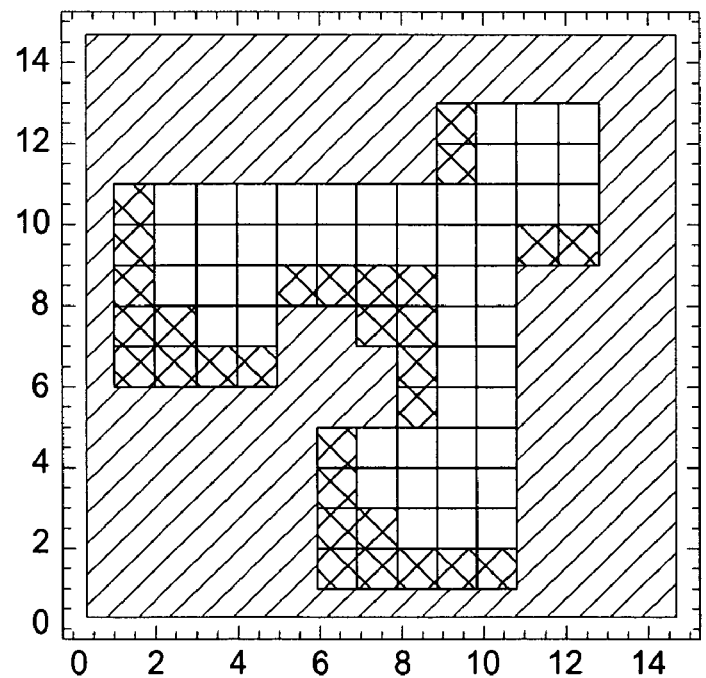
Figure 4C:
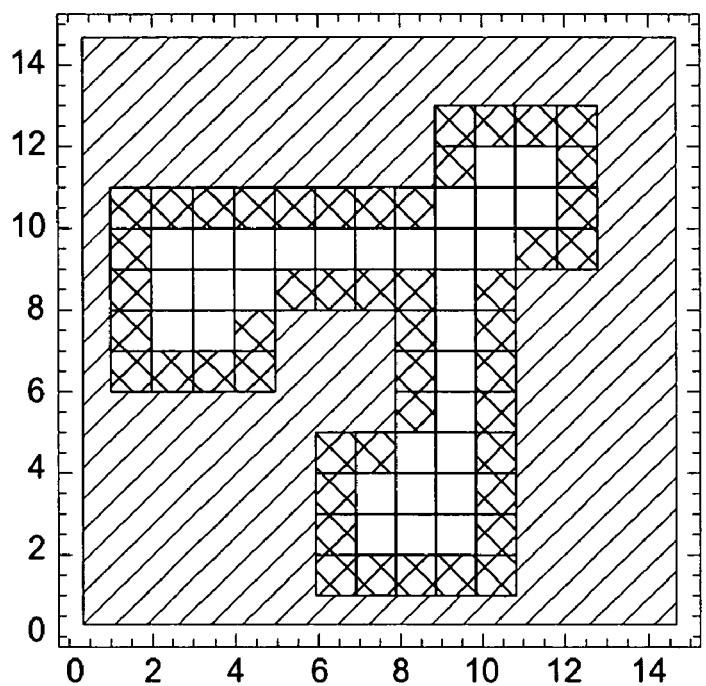
Figure 4D:
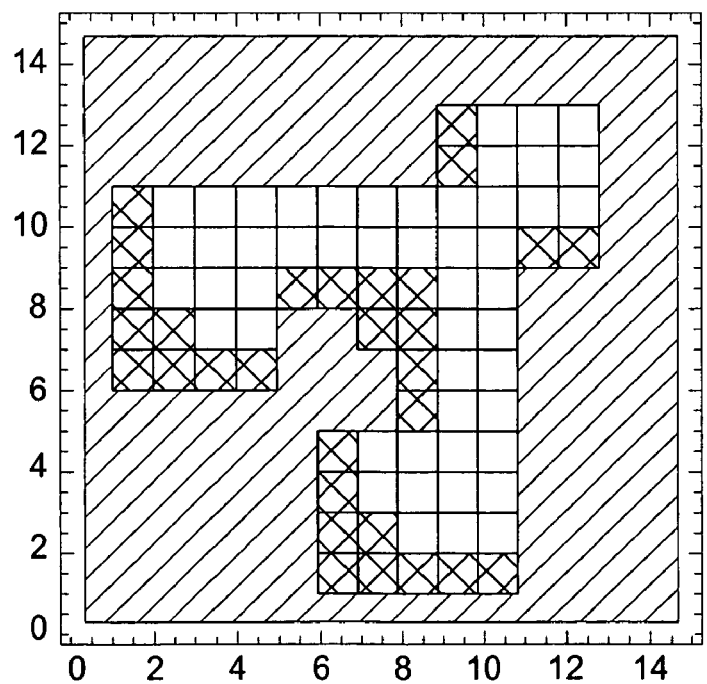
Figure 5:
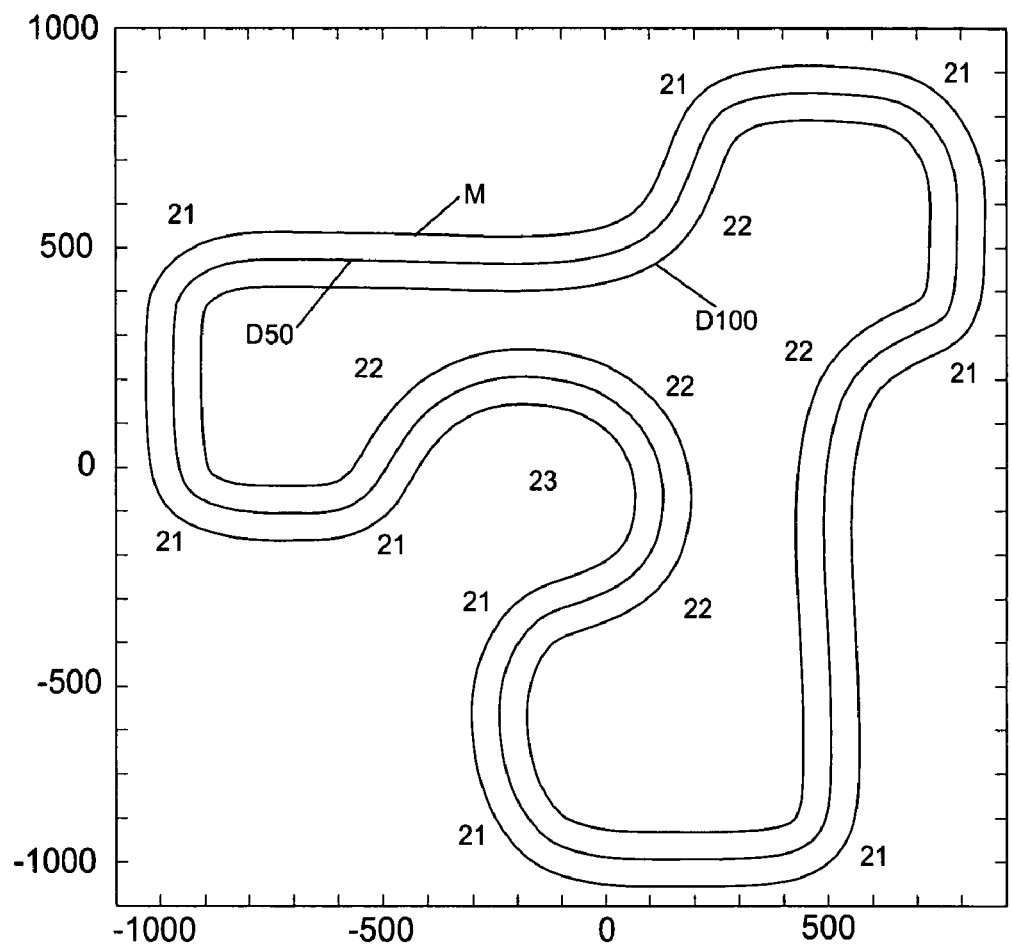
FIG. 5 presents nested aerial images of the parent/master pixel map of the polygonal elbow element [Curve M], an averaged 50 nm downsized daughter pixel map of the polygonal elbow element [Curve D50], and an averaged 100 nm downsized daughter pixel map of the polygonal elbow element [Curve D100].

Because of its simplicity and the relatively low number of operations (computations) required for implementing the invented algorithm, it is possible to perform multiple passes of each pixel map expressing an element or geometry primitives by a host computer [See FIG. 5. U.S. Pat. No. 5,553,170 (supra) & related description] to re-size an element expressed in the pixel map. The capacity to perform multiple passes enhances both the stability of the re-sized geometry object and increases accuracy in that the results of the multiple passes can be averaged (winnowed, summed and subtracted). FIGS. 3*a–*3*d* graphically show the results of four separate passes using the invented algorithm for downsizing the parent or master pixel map of the polygonal elbow element expressed in FIG. 1 by 50 nm. FIGS. 4*a–*4*d* graphically show the results of four separate passes using the invented algorithm for downsizing the parent or master pixel map of the polygonal elbow element expressed in FIG. 1 by 100 nm. In both examples, it is apparent that the resulting down sized daughter pixel maps are not congruent, but are similar. Well known computational techniques can be utilized for combining, winnowing and averaging the results of the separate passes to improve accuracy and the stability of such daughter pixel maps expressing the re-sized element or geometry primitive.

FIG. 6 illustrates aerial images of the curve M outlining the polygonal elbow element expressed in the parent or master pixel map, curve D50 outlining the daughter polygonal elbow element downsized 50 nanometers and D100 outlining the daughter polygonal elbow element downsized 100 nanometers respectively. The positive effects of averaging passes is apparent, particularly in the regions of the outside (convex) corners 21, and the inside (concave) corners 22.

Those skilled in the computational arts should also appreciate that look-up tables can be substituted for actual processing calculations, and that utilization of such look up tables may reduce processing times, particularly where the boundaries of the expressed elements in the processed pixel maps are limited to discrete slopes, and the corners are limited to discrete radii and angle.

Those skilled in the field of topology and morphology should also recognize that the invented sizing algorithm shrinks or expands the respective dose regions of a pixel map relative to each other, it does not magnify or de-magnify the pixel map or the elements expressed in the pixel map.

The essential operators developed for the invented algorithm are presented in C Code below to provide skilled topologist/morphologist with an appreciation of the incredible flexibility, and ease it can be adapted to obtain useful data from, and/or to implement morphological changes to planar or surface images expressed reproduced, created or rendered in grayscale pixel maps, while not expressly described, are contemplated as being within the scope of the present invention and discovery.

```
/************************************************************************
Title: Gradient Vector
Purpose: Calculates a gradient vector from a 3x3 matrix of Gray levels:
IN: GreyValue[0-8]   012
                     345
                     678
OUT: GradV floating point gradient vector
*************************************************************************/
static void GradientVector(float_vect_t *GradV,int GreyValue[])
{
    int X = GreyValue[2] - GreyValue[0] + GreyValue[5] - GreyValue[3]
        + GreyValue[8] - GreyValue[6];
    int Y = GreyValue[0] - GreyValue[6] + GreyValue[1] - GreyValue[7]
        + GreyValue[2] - GreyValue[8];
    double Norm = sqrt(X*X+Y*Y);
    if(Norm > 0)
    {
        GradV->x = (float)(X/Norm);
        GradV->y = (float)(Y/Norm);
    }
    else
    {
        GradV->x = 0;
        GradV->y = 0;
    }
}
/************************************************************************
Title: Mask Zeros Braces
Purpose: Check that neighbors of a center pixel in a 3x3 matrix of Gray levels are not in a certain
configuration:
IN: GreyValue[0-8]   012
                     345
                     678
OUT: configuration code for this pixel - 1 or z>>1
*************************************************************************/
static void MaskZerosBraces(char *z, int GreyValue[])
{
    if((GreyValue[0] == 0 && GreyValue[2] == 0) ||
        (GreyValue[2] == 0 && GreyValue[8] == 0) ||
         (GreyValue[6] == 0 && GreyValue[8] == 0) ||
          (GreyValue[6] == 0 && GreyValue[0] == 0))
            *z = 1;
}
/************************************************************************
Title: Zero Count
Purpose: Count zero dose neighbors of a center pixel in a 3x3 matrix of Gray levels:
IN: GreyValue[row][col]columns 0 -> 2
             rows ||
                  V
                  2
RETURN: zero neighbors code for this pixel - 0,1,2
*************************************************************************/
static int ZeroCount(int GreyValue[])
{
    int row, col, row3;
    int z = (GreyValue[4]==0)?-1:0;
    for(row=0;row<3;row++)
    {
        row3 = row*3;
        for(col=0;col<3;col++)
            if(GreyValue[row3+col] = = 0)
                z++;
    }
    if(z==2)
        MaskZerosBraces(&z,&(GreyValue[0]));
    if(z>1)
        return 2;
    return z;
}
/************************************************************************
Title: Inner Corner Code
Purpose: Create inner corner pixel code for a 3x3 matrix of edge values:
IN: EdgeValue[0-8]   012
                     345
                     678
RETURN: sum of edge values
*************************************************************************/
static int InnerCornerCode(int EdgeValue[])
{
```

```
        int row, col, row3;
        int v = 0;
        for(row=0;row<3;row++)
        {
            row3 = row*3;
            for(col=0;col<3;col++)
                v += EdgeValue[row3+col];
        }
return v;
}
/************************************************************************
Title: A 3x3 Table
Purpose: Creates a 3x3 matrix of Grey values around a center pixel
IN: pointer to the pixel in the greymap
OUT: GreyValue[0-8]   012
                      345
                      678
************************************************************************/
static void A3x3Table(int GreyValue[], char **GreyMap, int row, int col)
{
    /*first row*/
    GreyValue[0] = (int)GreyMap[row- 1][col-1];
    GreyValue[1] = (int)GreyMap[row- 1][col];
    GreyValue[2] = (int)GreyMap[row- 1][col+1];
    /*second row*/
    GreyValue[3] = (int)GreyMap[row][col-1];
    GreyValue[4] = (int)GreyMap[row][col];
    GreyValue[5] = (int)GreyMap[row][col+1];
    /*third row*/
    GreyValue[6] = (int)GreyMap[row+1][col-1];
    GreyValue[7] = (int)GreyMap[row+1][col];
    GreyValue[8] = (int)GreyMap[row+1][col+1];
}
/************************************************************************
Title: Propagate 45° Rule
Purpose: Propagates gray according to the 45° rule
IN: Pointer to sizing structure, row, col dg
************************************************************************/
static void Propagate45Rule(sizing_t *SzPtrs, int row, int col, float dg1, float xhat,
                            float yhat, int sign_x, int sign_y)
{
    if(SzPtrs->EdgeValue[row][col+sign_x]<2)
    {
        float g = SzPtrs->GreyValue_float[row][col+sign_x];
        float gcorr = (float)ceil(dg1*xhat*(1+yhat));
        float dgx = g - (float)(SzPtrs->Check[row][col+sign_x]*gcorr);
        int px = 1;
        SzPtrs->GreyValue_float[row][col+sign_x] = MAX(dgx,0);
        while(dgx < 0)/*disipate the rest of the grey*/
        {
            dgx = dgx*xhat*(1+yhat);
            if(SzPtrs->GreyValue[row][col+sign_x*(1+px)]>0)
            {
                float g = SzPtrs->GreyValue_float[row][col+sign_x*(1+px)];
                dgx = g - (float)(fabs(dgx)*(SzPtrs-
                    >Check[row][col+sign_x*(1+px)]));
                SzPtrs->GreyValue_float[row][col+sign_x*(1+px)] =
                    reduce_gray(g,dgx);
                px += 1;
            }
            else
                dgx = 0;
        }
    }
    if(SzPtrs->EdgeValue[row+sign_y][col]<2)
    {
        float g = SzPtrs->GreyValue_float[row+sign_y][col];
        float gcorr = (float)ceil(dg1*yhat*(1+xhat));
        float dgy = g - (float)(SzPtrs->Check[row+sign_y][co1]*gcorr);
        int py = 1;
        SzPtrs->GreyValue_float[row+sign_y][col] = MAX(dgy,0);
        while(dgy < 0)/*disipate the rest of the grey*/
        {
            dgy = dgy*yhat*(1+xhat);
            if(SzPtrs->GreyValue[row+sign_y*(1+py)][col]>0)
            {
                float g = SzPtrs >GreyValue_float[row+sign_y*(1+py)][col];
                dgy = g - (float)(fabs(dgy)*(SzPtrs-
                    >Check[row+sign_y*(1+py)][col]));
```

```
                    SzPtrs->GreyValue_float[row+sign_y*(1+py)][col] =
                            reduce_gray(g,dgy);
                    py += 1;
                }
                else
                    dgy = 0;
            }
        }
    }
}
/***************************************************************************
Title: Propagate Non 45° Rule
Purpose: Propagates gray according to the non 45° rule
IN: Pointer to sizing structure, row, col dg
***************************************************************************/
static void PropagateNon45Rule(sizing_t *SzPtrs, int row, int col, float dg1, float xhat,
                               float yhat, int sign_x, int sign_y)
{
    if(xhat > yhat)
    {
        if(SzPtrs->EdgeValue[row][col+sign_x]<2)
        {
            float g = SzPtrs->GreyValue_float[row][col+sign_x];
            float dgx = g - dg1*xhat*(1+yhat);
            int px = 1;
            SzPtrs->GreyValue_float[row][col+sign_x] = MAX(dgx,0);
            while(dgx < 0)/*disipate the rest of the grey*/
            {
                dgx = dgx*xhat*(1+yhat);
                if(SzPtrs->GreyValue[rowl][col+sign_x*(1+px)]>0)
                {
                    float g = SzPtrs-
                        >GreyValue_float[row][col+sign_x*(1+px)];
                    dgx = g - (float)(fabs(dgx)*(SzPtrS-
                        >Check[row][col+sign_x*(1+px)]));
                    SzPtrs->GreyValue_float[row][col+sign_x*(1+px)] =
                            reduce_gray(g,dgx);
                    px += 1;
                }
                else
                    dgx = 0;
            }
        }
    }
    if(yhat > xhat)
    {
        if(SzPtrs->EdgeValue[row+sign_y][col]<2)
        {
            float g = SzPtrs->GreyValue_float[row+sign_y][col];
            float dgy = g - dg1*yhat*(1+xhat);
            int py = 1;
            SzPtrs->GreyValue_float[row+sign_y][col] = MAX(dgy,0);
            while(dgy < 0)/*disipate the rest of the grey*/
            {
                dgy = dgy*yhat*(1+xhat);
                if(SzPtrs->GreyValue[row+sign_y*(1+py)][col>0)
                {
                    float g = SzPtrs-
                        >GreyValue_float[row+sign_y*(1+py)][col];
                    dgy = g - (float)(fabs(dgy)*(SzPtrs-
                        >Check[row+sign_y*(1+py)][col]));
                    SzPtrs->GreyValue_float[row +sign_y*(1+py)][col] =
                            reduce_gray(g,dgy);
                    py += 1;
                }
                else
                    dgy = 0;
            }
        }
    }
}
/***************************************************************************
Title: Propagate Gray to Neighbors
Purpose: Propagates gray to neighboring pixels in the direction of the gradient
IN: Pointer to sizing structure, row, col dg
***************************************************************************/
static void PropagateGrey(sizing_t *SzPtrs, int row, int col, float dg)
{
    float dg1 = dg - SzPtrs->GreyValue[row][col];
    float xhat = (float)fabs(SzPtrs->Gradient[row][col].x);
```

```
            float yhat = (float)fabs(SzPtrs->Gradient[row][col].y);
            int sign_x = (int)(SzPtrs->Gradient[row][col].x/xhat);
            int sign_y = (int)(-SzPtrs->Gradient[row][col].y/yhat);
            SzPtrs->GreyValue_float[row][col] = 0;
            if(xhat > COS45 && yhat > COS45)
            {
                /*45 degree rule only for partial edge pixels: edge code < 2*/
                Propagate45Rule(SzPtrs, row, col, dg1, xhat, yhat, sign_x, sign_y);
            }
            else
            {
                /*all angles but 45 degree rule*/
                PropagateNon45Rule(SzPtrs, row, col, dg1, xhat, yhat, sign_x, sign_y);
            }
}
/*******************************************************************************
Title: Inner Corner
Purpose: Checks if an inner corner to size it
IN: Pointer to sizing structure, row, col dg
*******************************************************************************/
static void InnerCorner(sizing_t *SzPtrs, int row, int col, float dg)
{
    int edgeValue[] = {0,0,0,0,0,0,0,0,0};
    A3x3Table(&(edgeValue[0]), SzPtrs->EdgeValue,row,col);
    if(InnerCornerCode(&edgeValue[0]==INNER_CORNER_VALUE)
    {/*inner corner*/
        float g = (float)SzPtrs->GreyValue[row][col];
        SzPtrs->GreyValue_float[row][col] =
         (float)reduce_gray(g, INNER_CORNER_FACTOR*dg);
    }
}
/*******************************************************************************
Title: Size a Frame
Purpose: Establishes the actual sizing of the Frame
IN: Pointer to sizing structure
*******************************************************************************/
static void SizeAframe(sizing_t *SzPtrs)
{
    int row,col, Rows = SzPtrs->GreyRows, Cols = SzPtrs->GreyCols;
    float dg = SzPtrs->dGrey;
    /*loop over pixels in frame*/
    for(row= 1;row<Rows;row++)
    {
        for(col= 1;col<Cols;col++)
        {
            if(SzPtrs->EdgeValue[row][col] == 1)
            {/*check if an inner corner*/
                InnerCorner(SzPtrs, row, col, dg);
            }
            else if(SzPtrs->EdgeValue[row][col] > 1)
            {/*no need to propagate*/
                if(SzPtrs->GreyValue[row][col]>dg)
                {
                    float g = (float)SzPtrs->GreyValue[row][col];
                    SzPtrs->GreyValue_float[row][col] = reduce_gray(g,dg);
                    SzPtrs->Check[row][col] = 0;
                }
                else
                {/*propagate dg*/
                    PropagateGrey(SzPtrs, row, col, dg);
                }/*propagate*/
            }
        }
    }
}
                        /********/
```

The invented sizing algorithm for shrinking or expanding respective dose regions expressing elements in pixel maps is broadly described in context of processing and computational steps in particular and exemplary computational formats and computer language systems. Skilled programmers, topologist and morphologists should recognize that such steps may be accomplished and/or be performed using different computational formats and different computer language systems that accomplish substantially the same result, in substantially manner, for substantially the same reason as that set forth in the following claims:

We claim:

1. A sizing method for sizing a parent grayscale pixel map expressing an image having edges using a computer, before projection onto a sensitive recording surface wherein the pixels have a size $R_p$, comprising the steps of:

(i) inputting the parent grayscale pixel map image with edges where an edge is defined by gray pixels having values between 1, 2, . . . n, or by pixels having at least one 0-gray value (black 0-dose level) pixel neighbor;

(ii) calculating a grayscale correction value (g) equal to a sizing distance S parameterized by a machine constant equal to $R_p$ divided by the number of grayscale values;

(iii) finding and flagging edge pixels expressed within a frame of the parent pixel map;

(iv) finding and flagging corner edge pixels within the frame;

(v) sliding a sub-matrix window within the frame, to calculate and store gradient values for each edge pixel relative to the edges within the frame;

(vi) looping over pixels within the frame to adjust the grayscale value of edge and corner pixels and neighboring pixels;

(vii) propagating new grayscale values per the grayscale correction value (g) to pixels from each adjusted edge and corner pixel within the frame in a direction normal to each edge to establish a new edge position within the frame; and (viii) where the parent pixel map is composed of a plurality of frames, reassembling the frames generating a daughter grayscale pixel map expressing a different size image than that expressed in the parent pixel map system which upon projection and recording, compensates for expected systemic distortions.

2. The method of claim 1, wherein the frame is a 5×5 matrix, and the sub-matrix window is a 3×3 matrix.

3. A sizing method for downsizing a parent grayscale pixel map having pixels of size $R_p$ and grayscale values between 0, 1, 2, . . . n, expressing an image having edges with grayscale values ranging from 1, 2, . . . n, using a computer, before projection onto a sensitive recording surface comprising the steps of:

calculating a factor g equal to a desired sizing distance S divided by a machine constant $K_m$ equal to pixel size $R_p$ divided by the number of grayscale values;

setting
$$G'(i, j) = \text{Max}(G(i, j) - g, 0), \text{ and}$$
$$\delta G(i, j) = |G(i, j) - g| \cdot (\nabla_x, \nabla_y)$$
looping over pixels
{
   if( pixel ij is an edge pixel)
   {
      $\nabla$(i, j) = estimated gradient;
      storing the value G'(i, j) of the new pixel;
      if(∥δG(i, j)∥) > 0
      {
         propagating vector differences to neighboring pixels along the gradient direction;
      }
   }
}
end.

4. A sizing method for upsizing a parent grayscale pixel map having pixels of size $R_p$ and grayscale values between 0, 1, 2, . . . n, expressing an image having edges with grayscale values ranging from 1, 2, . . . n, using a computer, before projection onto a sensitive recording surface comprising the steps of:

calculating a factor g equal to a desired sizing distance S divided by a machine constant $K_m$ equal to pixel size $R_p$ divided by the number of grayscale values;

setting
$$G'(i, j) = \text{Min}(G(i, j) + g, gmax), \text{ and}$$
$$\delta G(i, j) = |gmax - \{G(i, j) + g\}| \cdot (\nabla_x, \nabla_y)$$
looping over pixels
{
   if( pixel ij is an edge pixel)
   {
      $\nabla$(i, j) = estimated gradient;
      storing the value G'(i, j) of the new pixel;
      if(∥δG(i, j)∥) > 0
      {
         propagating vector differences to neighboring pixels along the gradient direction;
      }
   }
}
end.

5. The sizing method of claim 1 or 3 or 4, wherein edge pixels are flagged by successively mapping a sub matrix array G of pixel grayscale values from the parent grayscale pixel map into a an edge matrix E with a Boolean procedure for counting the 0-gray value pixels and for assigning a value to each pixel of 0, 1, or 2, where 0 indicates a particular pixel is not an edge pixel, 1 indicates a particular pixel is in a class consisting of inclined edge pixels and corner pixels, and 2 indicates a particular pixel is an edge pixel.

6. The sizing method of claim 5, wherein the sub matrix array G is a 3×3 matrix.

7. The sizing method of claim 6, wherein diverging corner edge pixels are flagged by successively mapping each edge matrix E into a Boolean I returning true if E has an edge_sum equal to 5 indicating a particular edge pixel is a diverging corner edge pixel, else returning false.

8. The sizing method of claim 5, wherein new grayscale values are propagated normal to edges of the parent grayscale pixel map to new edge positions with:

(i) a 45° rule computation operator for such edges inclined at 45° (π/4) relative to an orthogonal coordinate of the parent pixel map;

(ii) a non-45° rule computation operator for such edges inclined at angles other than 45° relative to an orthogonal coordinate of the parent pixel map; and (iii) a gray-to-neighbors computation operator for propagating gray values to pixels neighboring such edges in the direction of the gradient.

\* \* \* \* \*

UNITED STATES PATENT AND TRADEMARK OFFICE
CERTIFICATE OF CORRECTION

PATENT NO.        : 7,034,963 B2
APPLICATION NO.   : 09/903843
DATED             : April 25, 2006
INVENTOR(S)       : Klatchko et al.

It is certified that error appears in the above-identified patent and that said Letters Patent is hereby corrected as shown below:

On the face page, in "Assistant Examiner", in column 2, line 1,
delete "James A Thompson" and insert -- James A. Thompson --, therefor.

On the face page, in field (57), under "Abstract", in column 2, line 1, delete "edges 01" and insert -- edges of --, therefor.

On page 2, in field (56), under "U.S. Patent Documents", in column 1, line 4, after "6,631,216" delete "B1" and insert -- B2 --, therefor.

In column 6 (Table), line 2, delete "O FTHE" and insert -- OF THE --, therefor.

In column 7 (Table), line 1, delete "(float" and insert -- (float) --, therefor.

In column 7 (Table), line 1, delete "[col] = sign_x]" and insert -- [col+sign_x] --, therefor.

In column 9 (Table), line 5, delete "(SzPtrs" and insert -- SzPtrs --, therefor.

In column 9 (Table), line 47, below "}" insert --}--.

In column 11, line 32, delete "en" and insert -- an --, therefor.

In column 11, line 41, after "determines" delete "If" and insert -- if --, therefor.

Signed and Sealed this
Twenty-seventh Day of September, 2011

David J. Kappos
*Director of the United States Patent and Trademark Office*

CERTIFICATE OF CORRECTION (continued)
U.S. Pat. No. 7,034,963 B2

In column 11, line 41, after "the end." delete "if" and insert -- If --, therefor.

In column 17 (Table), line 29, delete "[rowl]" and insert -- [row] --, therefor.

In column 17 (Table), line 33, delete "(SzPtrS-" and insert -- (SzPtrs- --, therefor.

In column 21, line 21, in Claim 1, delete "where" and insert -- wherein --, therefor.

In column 21, line 37, in Claim 3, after "values;" insert -- and --.

In column 21, line 54, in Claim 3, delete "end." and insert -- end; and projecting the resultant grayscale pixel map onto a sensitive recording surface. --, therefor.

In column 22, line 7, in Claim 4, after "grayscale values;" insert -- and --.

In column 22, line 24, in Claim 4, delete "end." and insert -- end; and projecting the resultant grayscale pixel map onto a sensitive recording surface. --, therefor.